United States Patent [19]

Lutfy et al.

[11] 4,445,979
[45] May 1, 1984

[54] METHOD OF FORMING COMPOSITE SURFACE ON A DIELECTRIC SUBSTRATE

[75] Inventors: Joseph P. Lutfy, Highland; Thaddeus J. Grabowski, Taylor; Robert G. Arnold, Rochester, all of Mich.

[73] Assignee: General Motors Corporation, Detroit, Mich.

[21] Appl. No.: 520,477

[22] Filed: Aug. 4, 1983

[51] Int. Cl.³ .......................... C25D 5/02; C25D 5/56
[52] U.S. Cl. .................................. 204/15; 204/18.1; 204/20
[58] Field of Search ............... 204/15, 20, 18.1, 38 B, 204/38 E

[56] References Cited

U.S. PATENT DOCUMENTS 2,847,370 8/1958 Howard ............................ 204/18.1
3,565,770 2/1971 Young ............................... 204/18.1
3,591,352 7/1971 Kennedy ........................... 204/15
4,170,524 10/1979 Nakajyo .......................... 204/20

Primary Examiner—T. M. Tufariello
Attorney, Agent, or Firm—Lawrence B. Plant

[57] ABSTRACT

A process for providing a dielectric substrate with a composite surface comprising a metal plated portion side-by-side an unplated portion. The process includes: depositing a metallic film over the surface of the substrate; removing a narrow band of the film to electrically isolate one portion of the film from another; immersing the substrate in an electroplating bath capable of dissolving the film; cathodizing one of the film portions in the bath to electroplate that portion while the other portion dissolves therein to expose the underlying substrate. The thusly exposed substrate may subsequently be painted.

6 Claims, 8 Drawing Figures

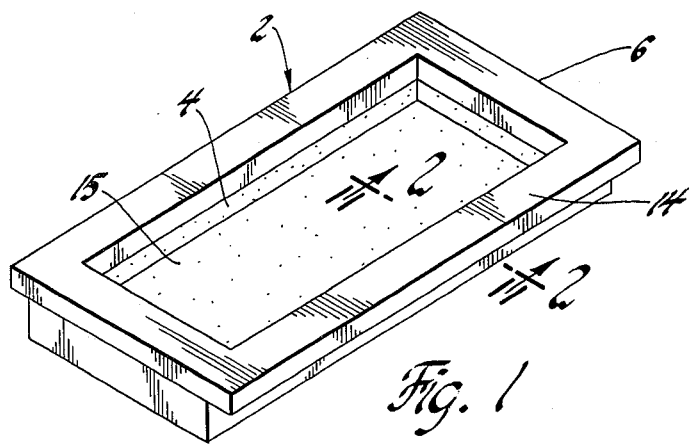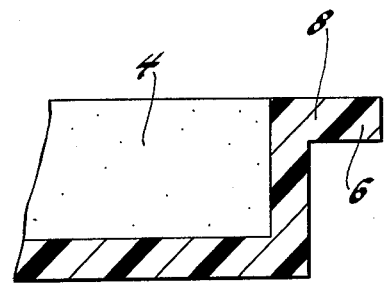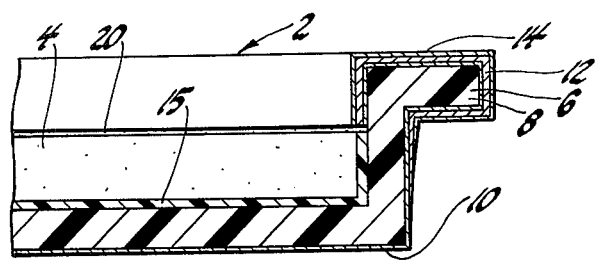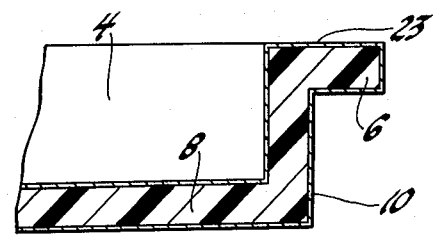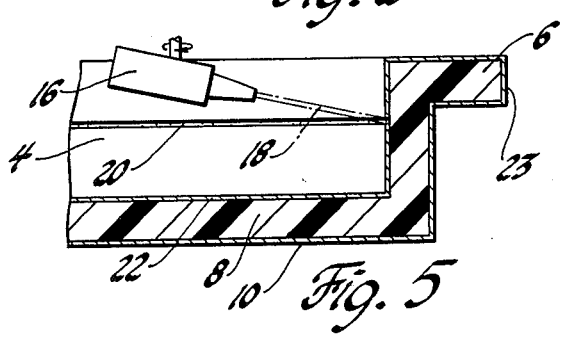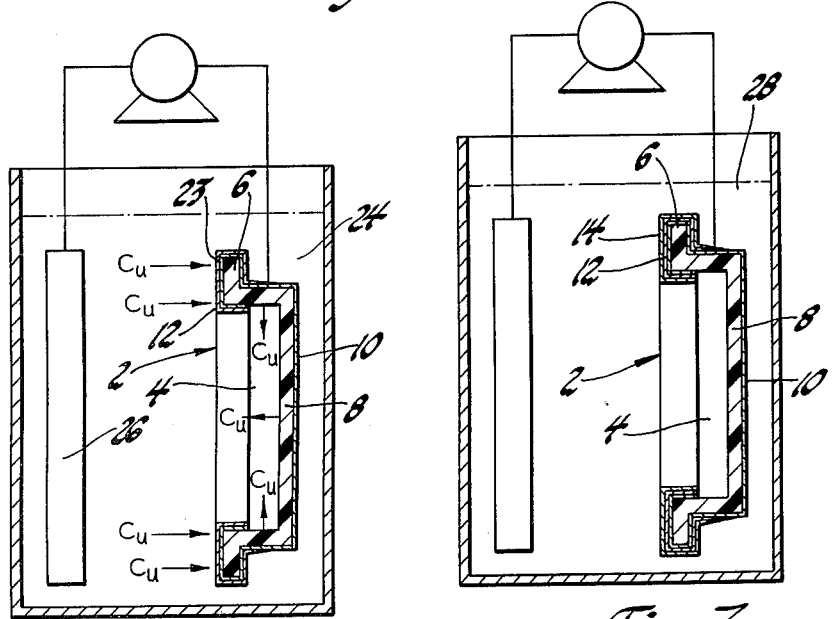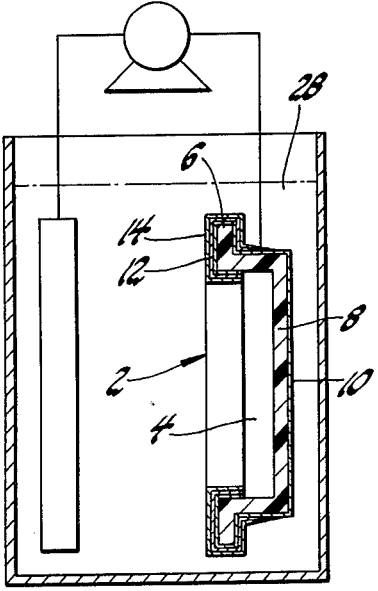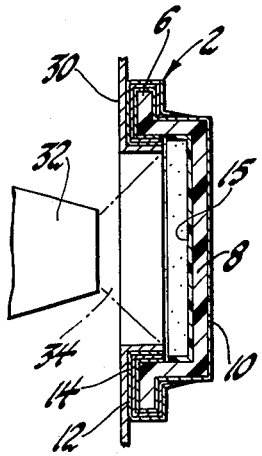

METHOD OF FORMING COMPOSITE SURFACE ON A DIELECTRIC SUBSTRATE

This invention relates to a process for providing a dielectric substrate with a composite surface.

BACKGROUND OF THE INVENTION

It is well known that a dielectric substrate (e.g., plastic) can be electroplated by first depositing a thin film of metal (e.g., copper) on its surface and then cathodizing the film in an appropriate electroplating bath to deposit the desired metal layer(s) (e.g., copper, nickel, chrome, etc.) atop the film. The metal film may be applied by a variety of techniques including electroless chemical deposition, vapor deposition, sputtering, etc. Polymeric substrates (e.g., acrylonitrile butadiene styrene, phenylene oxide, etc.) are typically so filmed by electrolessly depositing copper or nickel onto a previously etched and catalyzed surface of the substrate. Electroless copper preplating films are the most popular, and can be laid down using any number of a commercially available proprietary processes such as: the Crownplate TM system marketed by the Shipley Company; the Macuplex TM system marketed by the MacDermid Company; and the Enplate TM system marketed by Enthone, Inc. While each of these proprietary systems differ somewhat from the other they nonetheless function in essentially the same way—to wit, the polymer surface is primarily: cleaned; etched (i.e., in chromic acid or chromic-sulfuric acid) to provide micropits on the surface for anchoring the electrodeposit thereto; catalyzed (i.e., with tin/palladium salts or colloids) to initiate and nucleate the chemical deposition of copper from solution; and finally immersed in an electroless copper bath to chemically deposit the copper onto the surface. A variety of rinsing and neutralizing steps are interspersed the aforesaid primary steps as may be required. Alternatively electroless nickel preplating films may be deposited in essentially the same manner as is well known in the art. The substrate is then electroplated as desired by cathodizing the copper or nickel film in an appropriate electroplating bath(s).

Heretofore electroplating selective areas of dielectric substrates typically involved masking-off the substrate to sharply delineate those areas where plating was sought from those areas where plating was unwanted (hereafter the "no-plate" zone). Demasking of the substrate followed plating. Masking and demasking operations are often so cumbersome that many electroplaters will simply plate the entire surface rather than mask and demask the part being plated. Our copending U.S. patent application Ser. No. 520,478, which is filed concurrently herewith and assigned to the assignee of the present invention, describes a process which eliminates the need for masking and demasking operations ffect selective electroplating. According to Ser. No. 520,478 maskless selective plating of a dielectric substrate is effected by: (1) electrolessly depositing a thin film of copper on the surface of the substrate; (2) destroying a narrow band of the film by means of a laser beam so as to expose a narrow strip of the underlying dielectric which electrically isolates one zone of the film from another; (3) immersing the part in an electroplating bath; and (4) therein cathodizing only the zone of the film where plating is sought.

Many commercial products, and particularly automobile trim parts, comprise a dielectric polymeric substrate (e.g., ABS, phenylene oxide, etc.) having a composite surface including a decoratively metal plated (e.g., chromium) portion side-by-side and unplated substantially dielectric portion (i.e., exposed or painted substrate). The unplated portion may either match or contrast (e.g., black) with the principle color of the automobile. If the substrate itself is an acceptable color and/or texture it may serve as part of the composite surface. In such instances the substrate is merely masked off in areas where plating is not desired. Demasking follows. Such masking and demasking operations however are both cumbersome and costly. Where a painted surface is required, some manufacturers simply metal plate a large surface of the substrate and then selectively paint over the metal layer to achieve the desired aesthetic affect. Such plating-painting practices: consume excess electrolytic metal and associated plating current; limit the number of parts than can be plated at any one time; and typically result in relatively poor adhesion between the paint and the underlying electrolytic metal layer.

It is an object of the present invention to provide a time and cost effective process for providing a dielectric substrate with a composite surface including a metal plated portion side-by-side an unrelated substantially dielectric portion without the need for cumbersome masking/demasking operations.

It is another object of the present invention to provide a time and cost effective process for providing a dielectric substrate with a composite metal-paint surface.

It is still another object of the present invention to provide a process for providing a polymeric substrate with a composite surface including strongly adherent metal and paint portions in side-by-side relation one to the other.

These and other objects and advantages of the present invention will become more readily apparent from the detailed description thereof which follows.

BRIEF DESCRIPTION OF THE INVENTION

The present invention begins with the same selective plating technique (i.e., selective cathodization of isolated preplating metal films) which is the subject of Ser. No. 520,478 but goes on to dissolve the preplating metal film from the "no-plate" zones (i.e., areas of the substrate where plating is unwanted) while the selected areas are being plated. Dissolution of the preplating metal film from the "no-plate" zone exposes the underlying substrate thereof which may serve as either a final surface in its own right or as a more receptive (i.e., adhesion-wise) surface for subsequently applied layer(s) of paint.

According to a preferred embodiment of the invention, a polymeric substrate (e.g., ABS, Noryl, etc.) is: (1) etched in a chromic acid solution to micropit the surface; (2) catalyzed to initiate electroless copper deposition; (3) filmed with electroless copper; (4) laser traced to isolate the "no-plate" zones of the film from those to be plated; (5) immersed in an acid copper electroplating bath(s); (6) has its plateable zones cathodized in the electroplating bath; (7) has its uncathodized zones dissolved by the acid copper plating bath(s) to expose the underlying substrate; and (8) has its thusly exposed surface painted. The preferred process not only conserves plating metal and plating current but also results in better adhesion between the paint and the exposed etched surface than is possible between the paint and an underlying layer of electrolytic metal.

DETAILED DESCRIPTION OF A SPECIFIC EMBODIMENT

The invention may better be understood by reference to the following detailed description of a specific embodiment thereof which is given hereafter in conjunction with the several drawings in which:

FIG. 1 is an isometric view of a polymeric tray having a decoratively metal plated rim;

FIG. 2 is a partial elevational, sectional view taken in the direction 2—2 of FIG. 1;

FIGS. 3–8 are views similar to FIG. 2 depicting the several stages of the subject process.

The several figures depict a shallow tray 2 such, for example, as might be used to decoratively frame an automobile license plate. The tray 2 preferably comprises an etchable polymer (most preferably, ABS) and includes a recessed body portion 4 having a flange-like rim 6 about its periphery. The license plate (not shown) would lie within the recess portion 4 and be framed by the rim 6 when viewed in a direction normal to the plate. Chromium plating of the rim 6 presents an aesthetically appealing view of the license. Since the license plate would cover, and hence substantially hide, the bottom of the recess 4, there is no need to plate anything more than the rim 6 to achieve the desired visual affect. Hence, the remainder of the substrate may be left unplated or, as here, will preferably be painted to enhance the visual appeal. As best shown in FIG. 2, the plated-painted tray 2 will comprise an ABS substrate 8, an electroless copper film 10, an electrolytic copper layer 12 covering the rim 6, additional electrolytic metal (e.g., nickel, chromium, etc.) layer(s) 14 (only one shown) atop the electrolytic copper 12 and a coating of paint 15 applied directly to the substrate 8 at the bottom of the recessed portion 4.

The process of the present invention begins with an uncoated substrate 8 such as shown in FIG. 3. The substrate 8 is provided with an electroless copper film 10 (see FIG. 4) using the aforesaid Macuplex TM preplating system. More specifically the substrate is: cleaned, etched in a chromic acid solution to micropit the surface; neutralized to remove residual Cr$^{+6}$; activated in a muriatic acid solution; catalyzed in a Sn-Pd emulsion; and finally filmed with copper 10 in a formaldehyde-type electroless copper plating bath.

As only the rim 6 is to be plated, those areas of the film 10 which would otherwise plate (i.e., if cathodized in a plating bath) are electrically isolated from the portion of the film 10 covering the rim 6. To this end, the zone 22 (see FIG. 5) of the copper film 10 within the recessed portion 4 is electrically isolated from the remainder of the film 10 in the manner described, in our aforesaid copending application Ser. No. 520,478. In this regard, a laser beam 18 from laser generator 16 is projected onto the film 10 and traced along the inside of the tray 2 just under the lip 6. The beam 18 evaporates a narrow band of the copper film 10 off of the substrate 8 and leaves a narrow strip 20 (i.e., about ¾ mm wide) of dielectric ABS surface exposed. The strip 20, being nonconductive, electrically isolates the zone 22 from the remainder of the film 10 and especially from the rim-covering portion 23 thereof.

A layer(s) of electrolytic copper 12 is deposited on rim 6 by immersing the tray 2 in a conventional acid copper electroplating bath(s) 24 and cathodizing the zone 23 of the film 10. Preferably an initial copper strike layer is applied to the skin 10 as from an acid strike bath (e.g., Udylite) comprising 125 g/l copper sulfate, 55 g/l sulfuric acid, 15 g/l ferrous sulfate and 3 liters of HCl. Thereafter a heavier layer of copper is deposited as from an acid copper plating bath (e.g., Udylite) comprising 180 g/l copper sulfate, 75 g/l sulfuric acid, 18 g/l ferrous sulfate and 13.5 liters of HCl. As best shown in FIG. 6, the zone 23 of the conductive film 10 which covers the rim 6 is cathodized in the acidic plating bath 24 opposite an appropriate copper anode 26. The unpolarized zone 22 of the film 10 which is electrically isolated from the cathodized zone 23 not only receives no electrolytic copper but, in fact, is dissolved in the acid plating bath(s). Dissolution of the unpolarized film 22 not only exposes the underlying etched ABS surface but also replenishes some of the copper lost from the plating bath. As illustrated in FIG. 7, additional electrolytic metal layer(s) 14 (e.g., Ni, Cr, etc.) may be electrodeposited atop the electrolytic copper 12 in appropriate plating baths 28.

If the surface of the substrate 8 exposed by dissolution of the film 22 is aesthetically acceptable in and of itself, no decorative coating thereof is required and the composite surface of the finished product will comprise simply the plated rim 6 adjacent the exposed substrate previously underlying the film zone 22. It is preferred, however, to paint the exposed substrate in order to insure optimum color control and surface finish. Accordingly, after the desired number and type of electrodeposits have been applied to the rim 6, a shield 30 is positioned over the rim 6 and paint 34 from nozzle 32 is sprayed onto the etched surface exposed by the dissolution of the electroless copper portion 22. Any number of coats of paint 15 (only one shown) may be applied in this manner including such primer and/or top coat layer(s) necessary to achieve whatever leveling, hiding and/or finish as may be required. Organic-solvent-based (e.g., ketones) lacquers are preferred for painting polymeric substrates such as ABS as such are known to result in good adhesion even without the additional adhesion resulting from bonding to the etched and micropitted surface resulting from dissolution of the electroless copper film 22.

While this invention has been described in terms of specific embodiments thereof it is to be understood that it is not limited thereto but rather only to the extent set forth hereafter in the claims which follow.

The embodiments of the invention in which an exclusive property or privilege is claimed are defined as follows:

1. A process for providing a dielectric substrate with a composite surface including a metal plated portion adjacent an unplated portion comprising the steps of:
    (a) depositing a substantially continuous metallic film atop said substrate;
    (b) removing a narrow band of said film so as to expose a correspondingly narrow strip of said substrate, said strip defining a first zone of said film which is substantially coextensive with said plated portion and serving to electrically isolate said first zone from a second zone of said film which is substantially coextensive with said unplated portion;
    (c) immersing said zones in a metal electroplating bath which is capable of dissolving said film;
    (d) cathodizing said first zone in said bath in such manner as to commence electrolytic deposition of at least part of said metal plated portion thereon before any significant dissolution of said first zone occurs; and (e) concurrently with said cathodizing, dissolving said second zone in said bath to expose said substrate on said surface.

2. The process according to claim 1 wherein said electroplating bath comprises cations of the metal comprising said film whereby dissolution of said second zone additionally replenishes part of said bath with said metal.

3. The process according to claim 2 wherein said film comprises copper and said bath is strongly acidic.

4. A process for providing a dielectric substrate with a composite coating including a metal ated portion adjacent a painted portion comprising the steps of:

(a) depositing a substantially continuous metallic film atop said substrate;

(b) removing a narrow band of said film so as to expose a correspondingly narrow strip of said substrate, said strip defining a first zone of said film which is substantially coextensive with said plated portion and serving to electrically isolate said first zone from a second zone of said film which is substantially coextensive with said painted portion;

(c) immersing said zones in an electroplating bath which is capable of dissolving said film;

(d) cathodizing said first zone in said bath in such manner as to commence electrolytic deposition of at least part of said metal plated portion thereon before any significant dissolution of said first zone occurs;

(e) concurrently with said cathodizing, dissolving said second zone in said bath to expose the underlying surface; and (f) coating said exposed surface with at least one layer of paint.

5. A process for covering a polymeric substrate with a composite coating including a metal plated portion adjacent a painted portion comprising the steps of:

(a) etching the surface of said substrate to provide a plurality of micropits thereon to serve as anchorage sites for said coating;

(b) catalyzing said surface so as to provide a plurality of nucleating sites for initiating the electroless deposition of a metal film thereon;

(c) electrolessly depositing a substantially continuous metallic film atop said catalyzed surface;

(d) removing a narrow band of said film from said surface so as to expose a correspondingly narrow strip of said substrate, said strip defining a first zone of said film which is substantially coextensive with said metal plated portion and serving to electrically isolate said first zone from a second zone of said film which is substantially coextensive with said painted portion;

(e) immersing said zones in an electroplating bath which is capable of dissolving said film;

(f) cathodizing said first zone in said bath in such manner as to commence electrolytic deposition of at least part of said metal plated portion thereon before any significant dissolution of said first zone occurs;

(g) concurrently with said cathodizing, dissolving said second zone in said bath to expose the underlying etched surface; and (h) coating said exposed etched surface with at least one layer of an organic-solvent-based paint.

6. A process for coating a polymeric substrate with a composite layer including a metal plated portion side-by-side a painted portion comprising the steps of:

(a) etching the surface of said substrate to provide a plurality of micropits thereon to serve as anchorage sites for said coating;

(b) catalyzing said surface so as to provide a plurality of nucleating sites for initiating the electroless deposition of a metal film thereon;

(c) electrolessly depositing a substantially continuous copper film atop said catalyzed surface;

(d) directing a narrow laser beam onto said film and tracing it along a predetermined path, said laser beam having sufficient intensity to evaporate said copper off of said surface so as to expose a narrow strip of said substrate, said strip defining a first zone of said film which is substantially coextensive with said metal plated portion and serving to electrically isolate said first zone from a second zone of said film which is substantially coextensive with said painted portion;

(e) immersing said zones in an acidic copper electroplating bath;

(f) cathodizing said first zone in said bath in such manner as to commence electrolytic deposition of copper on said first zone before any significant dissolution of said first zone occurs;

(g) concurrently with said cathodizing, dissolving said second zone in said bath to expose the underlying etched surface; and (h) coating said exposed etched surface with at least one layer of an organic-solvent-based paint.

* * * * *

UNITED STATES PATENT AND TRADEMARK OFFICE
CERTIFICATE OF CORRECTION

PATENT NO. : 4,445,979
DATED : May 1, 1984
INVENTOR(S) : Joseph P. Lutfy; Thaddeus J. Grabowski; Robert G. Arnold It is certified that error appears in the above—identified patent and that said Letters Patent is hereby corrected as shown below:

Column 1, line 56, "ffect" should read -- to effect --.

Column 2, line 26, "unrelated" should read -- unplated --.

Column 5, line 14, "ated" should read -- plated --.

Signed and Sealed this

Eighteenth Day of December 1984

[SEAL]

Attest:

GERALD J. MOSSINGHOFF

Attesting Officer

Commissioner of Patents and Trademarks